Nov. 21, 1961 B. S. WILDI 3,009,976

THERMOELECTRIC DEVICE

Filed June 1, 1959 2 Sheets-Sheet 1

INVENTOR.
BERNARD S. WILDI
BY Lloyd B. Stevens, Jr.
ATTORNEY

INVENTOR.
BERNARD S. WILDI
BY
Lloyd B. Stevens, Jr.
ATTORNEY

United States Patent Office 3,009,976

Patented Nov. 21, 1961

3,009,976

THERMOELECTRIC DEVICE

Bernard S. Wildi, Dayton, Ohio, assignor to Monsanto Chemical Company, St. Louis, Mo., a corporation of Delaware Filed June 1, 1959, Ser. No. 817,347
18 Claims. (Cl. 136—4)

The invention relates to organic thermoelectric devices. More particularly the invention involves polyphthalocyanine bodies useful in thermoelectric devices. These bodies can suitably be in the form of discs, wafers, bars, rods, rectangular parallelepipeds, round, or most any geometric shape.

It is well known in the art to employ certain inorganic materials as thermoelectric components; however, no suitable organic material has previously been known. It has now been discovered that a certain type of organic materials is useful for this purpose. These materials which are polyphthalocyanines are described in detail in copending application Serial No. 696,027, filed November 13, 1957.

It is an object of this invention to provide new and useful thermoelectric bodies.

It is another object of this invention to provide new and useful thermoelectric devices.

It is another object of this invention to provide new and useful thermoelectric devices for generating direct current power.

It is another object of this invention to provide new and useful devices for cooling thermoelectrically.

These and other objects of the invention will become apparent as the detailed description of the invention proceeds.

In making the thermoelectric bodies of the invention pyromellitonitrile, a new compound described in copending application Serial No. 696,026, filed November 13, 1957, now abandoned, is used. The tetrafunctional pyromellitonitrile provides the new class of polymeric material which can be illustrated by the structural formula

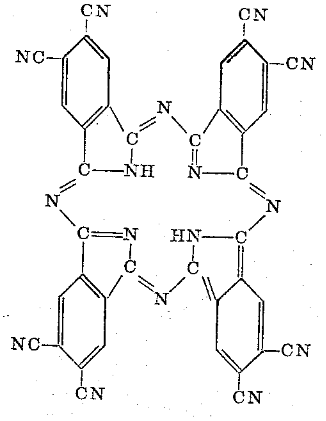

The pair of nitrile groups on each of the four cyclic portions of the phthalocyanine structure are in turn joined with and form a part of similar phthalocyanine structures to provide a polyphthalocyanine. Whereas, the above structural formula is illustrative of the metal-free polyphthalocyanine, it will be readily understood that the metal polyphthalocyanines will have a similar structure. Illustrative of a monomeric metal phthalocyanine is copper phthalocyanine of the following structure

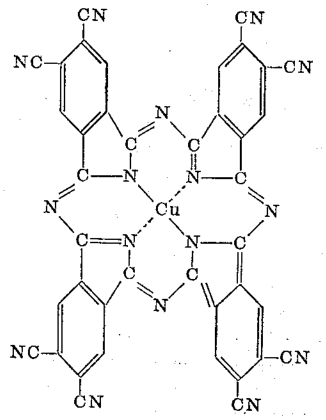

The preparation of the polyphthalocyanines and the metal polyphthalocyanines is described and illustrated in detail in copending application Serial No. 696,027, filed November 13, 1957. Thus, the polymeric materials useful in making the discs or wafers of this invention are, for example, polyphthalocyanine, zinc polyphthalocyanine, copper polyphthalocyanine, iron polyphthalocyanine, cobalt polyphthalocyanine, nickel polyphthalocyanine, palladium polyphthalocyanine, platinum polyphthalocyanine, lead polyphthalocyanine, magnesium polyphthalocyanine, and the like.

The following examples illustrate the preparation of copper polyphthalocyanine useful in making the bodies of the invention.

*Example 1*

A mixture of 16 grams of pyromellitonitrile, 53 grams of cuprous chloride and 1 gram of urea was heated at 300° C. under 1,000 p.s.i. of nitrogen pressure for 18 hours, and for 2 additional hours at 350° C. After the reaction vessel had cooled to room temperature the solid product was ground using a mortar and pestle. The ground material was triturated with ethanol, acetone, and ethyl acetyl acetate in the order given. No coloring of the solvents occurred, so it is assumed that there was no appreciable extraction from the powdered material. The material was next triturated with pyridine at room temperature and a considerable amount of green material was removed in the pyridine. The sample was then triturated with boiling pyridine until the triturates were colorless, and the triturated material was dried at room temperature. Further processing of the dried material consisted of subjecting the material to vacuum sublimation at 350° C./0.5 mm. of Hg for 72 hours. Some white material sublimed out and was discarded. The residue from the sublimation operation was placed in a Soxhlet apparatus and was extracted with pyridine for 48 hours. At the end of this 48 hour period the extracts from the residue were colorless. The residue was then filtered and washed with ethanol. Again the residue was subjected to sublimation procedure heating at 340° C./0.05 mm. of Hg for 6 hours. A small amount of white material sublimed out and was discarded. An elemental analysis of the residue product was as follows:

| Percent | Found | Calc'd. for $C_{20}H_4N_8Cu$ |
|---|---|---|
| C | 52.8 | 57.2 |
| H | 1.3 | 0.96 |
| N | 26.6 | 26.7 |
| Cu | 15.9 | 15.1 |

*Example 2*

This example describes the heat treatment of a sample of the material of Example 1 to produce a material of different composition. A sample of 0.65 gram of a product of Example 1 was heated for 18 hours at 410° C./0.25 mm. of Hg. The sample lost 10.8% of its original weight.

An elemental analysis of this heat treated sample was as follows:

| Percent: | Found |
|---|---|
| C | 52.7 |
| H | 1.3 |
| N | 24.2 |
| Cu | 16.6 |

It has been experimentally determined that when copper polyphthalocyanine is made as described hereinabove having an excess of copper over that stoichiometrically required that the material has P-type conductivity; however, when copper polyphthalocyanine is produced having less than the stoichiometric amount of copper then the material has N-type conductivity. The degree of P-type or N-type conductivity will vary with the excess or deficiency of copper. The same situation prevails where other metals than copper are used.

*Example 3*

This example illustrates the thermoelectric testing of the product of Example 1. A sample of the product of Example 1 was cold pressed at a pressure of 20,000 p.s.i. to form a ½ inch diameter disc 3.7 mm. in thickness. The thermoelectric testing of the disc was carried out in the following fashion: The disc was placed on a copper plate which as the cold electrode of the thermoelectric generator was at a temperature of 23° C. The hot electrode for the generator was a soldering iron, which was mounted in a jig and could be raised or lowered by a screw arrangement. The soldering iron was pressed against the upper surface of the disc with sufficient pressure being applied to give good ohmic contact both for the soldering iron and the copper plate with the copper polyphthalocyanine disc. The series electrical circuit was completed from the copper plate through a galvanometer back to the soldering iron through the disc to the copper plate. In the test the hot probe was first heated before being applied to the wafer or disc of copper polyphthalocyanine. For each reading which was taken using a different hot probe temperature the apparatus was allowed to come to equilibrium, and the highest voltage generated was noted. If the hot probe is maintained in contact with the disc over a long period of time the cold copper electrode tends to approach the temperature of the hot probe, due to heat conduction through the disc. This is the reason for taking the highest voltage noted on the galvanometer as the reading, because this is, in fact, indictative of the thermoelectric properties of the disc. The following data were obtained when operating in the manner described above using the 3.7 mm. disc described hereinabove:

| ΔT, ° C.[1] | Copper Polyphthalocyanine, μv. (microvolts) | Silicon,[2] μv. (microvolts) |
|---|---|---|
| 2 | −11.5 | −13 |
| 3 | −19.5 | −20 |
| 7.3 | −29 | −30 |
| 11.9 | −54 | −52 |
| 16.9 | −88 | −160 |
| 27.3 | −163 | −390 |
| 30.8 | −210 | −630 |
| 55 | −250 | −1,600 |

[1] ΔT is defined as the difference in temperature between the hot probe and the cold electrode.
[2] The comparison shown in column 3 is with a sample of N-type silicon of approximately the same thickness and size.

The data above indicates that as to thermoelectric properties at temperature differences of the order of 2° C. and probably to about 15° C. copper polyphthalocyanine is comparable to an N-type silicon. It is realized that the particular sample of N-type silicon used may be far from optimum as to thermoelectric properties, but then copper polyphthalocyanine can also undoubtedly be improved substantially by doping techniques, heat treatment, etc. The minus signs on the voltages recorded in the tabular data shown immediately above indicate predominantly N-type conductivity in the sample tested.

A comparison was also made between a sample similar to the product of Example 1 and a disc of this similar material which had been heat treated in a manner similar to that described in Example 2. The material in Example 2 was, of course, heat treated in powdered rather than disc form. Another sample in disc form which had not been heat treated exhibited a thermoelectric generating power of −5μ volts/° C. as compared to −24μ volts/° C. for the sample after heat treating. Thus it is seen that the heat treated sample is about five times as effective as a thermoelectric generator.

The invention will be more clearly understood from the following detailed description of specific embodiments thereof read in conjunction with accompanying drawings wherein.

Figure 1:
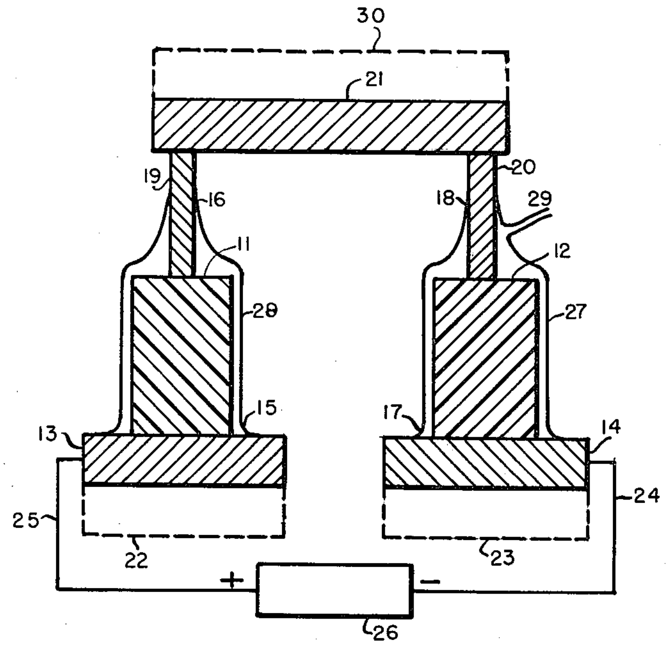
FIGURE 1 is an elevational view partially in section of one embodiment of the invention.

FIGURE 1 broadly embodies a thermoelectric device which can be either a thermoelectric generator or a thermoelectric cooling device depending on the designation of certain of the components. For the thermoelectric generating device a body 11 in the form of an N-type wafer or disc of copper polyphthalocyanine is used, and body 12 is a P-type wafer of copper polyphthalocyanine. Electrodes leading from the tops of the discs 11 and 12 are numbered 19 and 20, and these electrodes can be copper, aluminum or other suitable conductors. Ohmic contact can be made between discs 11 and 12 and electrodes 19 and 20, respectively, by coating the upper surface of the discs with silver or other noble metal and soldering the electrodes thereto, with, e.g., a lead-tin eutectic alloy having some cadmium therein. The coating of silver, for example, can be applied to the top of the discs by evaporation of the silver on to the disc tops or alternatively with silver paint, which is commercially available. The other ends of the electrodes 19 and 20 are then connected by soldering or other suitable mechanical means to cold junction body 21, which is a copper or aluminum rectangular plate. The hot junctions of the device consist of copper or aluminum bodies 13 and 14, which are suitably in the form of rectangular plates and are electrically connected to discs 11 and 12 in a similar manner as were electrodes 19 and 20.

Discs 11 and 12 can be enclosed in glass shells 27 and 28, which are sealed to the hot junction bodies 13 and 14 which are rectangular copper or aluminum plates by metal to glass seals 15 and 17. These metal seals for use in sealing metal to glass, i.e., making metal to glass junction seals, are well known and commercially available. Similar metal seals 16 and 18 are used to seal the glass envelope to electrodes 19 and 20. Glass seals such as have been proposed can be used where it is desirable to encapsulate the discs for one reason or another. Disc 11 which has the N-type conductivity will show this conductivity in the open air without the presence of the seal. A particularly good method of obtaining a P-type thermoelectric disc is to heat the disc under high vacuum of about $10^{-2}$ to $10^{-5}$ mm. of Hg through several cycles to 250° C. allowing the disc to cool to room temperature after each heating, i.e., the conventional out-gassing technique. By this out-gassing technique a good P-type copper polyphthalocyanine disc is produced. Since these P-type discs will upon exposure to the atmosphere revert to N-type, it is necessary to carry on the out-gassing within the glass envelope 27, which has an outlet 29 for attachment of a vacuum pump. When the out-gassing procedure is completed outlet 29 is sealed leaving disc 12 encapsulated under high vacuum.

If the device of FIGURE 1 is to be a thermoelectric generating device, elements 22 and 23 are some sort of heating source, such as a heating jacket, gas burners, etc. It is desirable although not mandatory that the cold junction 21 have the heat removed therefrom by a cooling jacket 30, which is attached to plate 21. Cooling fluid, for example, water is circulated through jacket 30 to remove the heat transmitted by the hot junctions to plate 21. Suitably also, plate 21 is cooled by forced drafts of air as by a fan blowing over the surface of plate 21. With such an arrangement as this, i.e., heated plates 13 and 14 and cooled plate 21, a thermoelectric current will be generated in discs 11 and 12, and if 26 is a load such as a radio receiver, a storage battery to be charged, a microswitch or other type of switch to be operated, or other electrical device, power will be provided to operate the electrical device. The positive and negative terminals of the device are indicated in FIGURE 1 at opposite ends of load 26. Voltage generated can be increased by connecting a number of such N-type and P-type bodies in series. For increased current flow, a number of the bodies are connected in parallel.

If instead of a load 26, a battery 26 or other direct current source of electricity is connected with positive and negative terminals as indicated in FIGURE 1, a thermoelectric cooling system results. In this system the cold junction will be plate 21 and the hot junctions plates 13 and 14. In a refrigerating apparatus, for example, or for that matter in other cooling devices, it is desirable for maximum heat removal from the hot junctions to add cooling fins to plates 13 and 14. Also, suitably heat transfer fins are added to plate 21 to absorb heat and transmit it to plate 21. For use in refrigeration cold junction 21 would, of course, be positioned within the compartment or area to be cooled, whereas the hot junctions would be positioned outside of the area being cooled. A number of devices of FIGURE 1 could be electrically connected in parallel or in series as would be most appropriate to increase the cooling surface and capacity.

Figure 2:
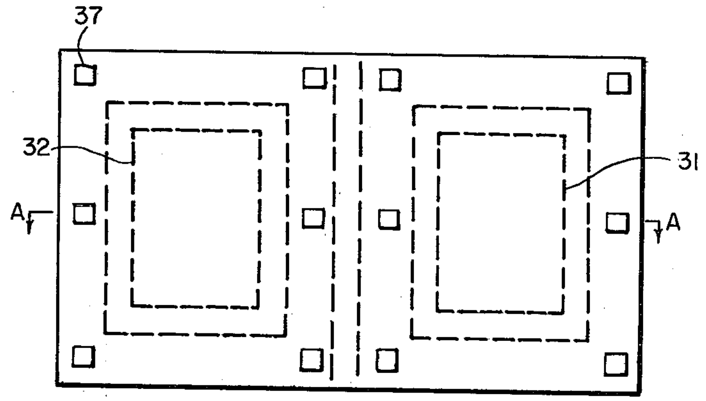
FIGURE 2 is a top view of another embodiment of the invention.
Figure 3:
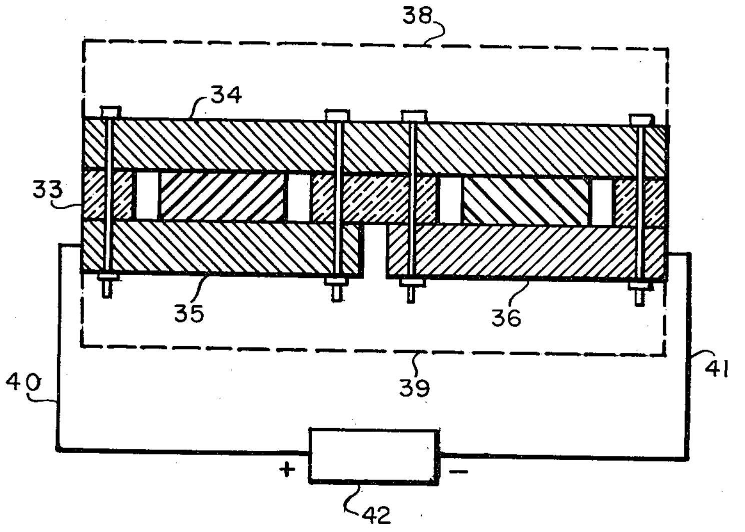
FIGURE 3 is an elevational view partially in section of the same embodiment as FIGURE 2.

FIGURES 2 and 3 show another embodiment of the invention. Bodies 31 and 32 suitably in the form of rectangular metal plates are P-type and N-type copper polyphthalocyanine, respectively. Body 34 suitably a copper or aluminum rectangular plate serves as the cold junction for the device, being bonded to plates 31 and 32 in a similar manner to that described in FIGURE 1. The hot junction bodies 35 and 36 suitable copper or aluminum plates are in a like fashion electrically connected to discs 31 and 32 to form ohmic junctions therewith. Gasket 33 is normally preferably made of an inorganic material such as glass, mica, or other materials which will withstand high temperatures, if the thermoelectric device is to be subjected to high temperature. If the device is not to be subjected to high temperatures, rubber or other similar gaskets can be used. Gasket 33 serves as an insulating separator between plates 34 and 35 and 36, and also serves to enclose on the sides thermoelectric discs 31 and 32. Thus with the metal plates 34, 35 and 36, and the gasket 33, plates 31 and 32 are encapsulated in separate compartments surrounded on the sides by vapor spaces. To prevent electrical short-circuiting of the device bolts and nuts 37 must be insulated from metal plates 34, 35 and 36 by electrical insulating washers and sleeves made of conventional materials such as rubber or inorganic materials described above, if the device is to be used at high temperatures.

As in FIGURE 1, if the device is a thermoelectric generator, it is necessary to have a heating means 39 which can be the same as described in FIGURE 1 for heating hot junctions which are plates 35 and 36, and it is desirable for maximum efficiency although not mandatory that cold junction plate 34 be cooled by conventional means 38 such as are described with respect to FIGURE 1. If the same type of thermoelectric copper polyphthalocyanines are used in the embodiment of FIGURES 2 and 3, as were used in FIGURE 1, a problem is presented of encapsulating the P-type plate within the device without exposure to the atmosphere. Actually it is the water vapor in the atmosphere that causes the P-type to revert to the N-type. Therefore, if the P-type copper polyphthalocyanine is made by the outgassing technique described in FIGURE 1 within a dry box assembly using, for example, liquid sodium in the assembly as is well known to reduce the moisture content to practically nothing, then the P-type plate 31 can be incorporated in the device and encapsulated therein in a dry state and it will remain P-type. There is, of course, no problem in assembling the N-type plate 32 within the device of FIGURES 2 and 3, since plate 32 will normally have N-type conductivity. Leads 40 and 41 connect electrically hot junction plates 35 and 36 with a load 42, which can suitably be the same type of load as employed in the thermoelectric generator of FIGURE 1.

If the device of FIGURES 2 and 3 is used as a thermoelectric cooling device, it is desirable to attach fins to hot junctions 35 and 36. It is also desirable to employ a blower or other cooling device 39 for the purpose of aiding the removal of heat from the hot junctions. Likewise it is desirable to employ cooling fins attached to cold junction 34 for gathering heat from the enclosure which is being cooled and conducting it to the cold junction. A D.C. voltage source 42 such as a battery is connected in the circuit as indicated by the plus and minus terminals on FIGURE 3 to serve as the source of power to operate the cooling device.

As in the case of the device of FIGURE 1 whether used for electrical power generation or cooling, a number of the devices of FIGURES 2 and 3 can suitably be electrically connected in parallel or series.

If the thermoelectric discs are not enclosed in housings such as in FIGURE 1 and FIGURES 2 and 3, it is desirable to encapsulate the discs except at the electrode connections, for example, by covering the discs with a protective film of silicone varnish, glass, plastic resin, etc.

The devices described above using the undoped copper polyphthalocyanine for the N-type conductivity is not normally used at temperatures above about 100° C.; however, there is no lower limit on temperatures at which the device can be operated. If, instead of the N-type copper polyphthalocyanine disc described in the above devices, a disc of N-type bismuth telluride or other N-type inorganic or organic material having thermoelectric properties, is used, of course, the device can be used at appreciably higher temperatures up to about 350° C. or possibly somewhat higher.

In copending applications Serial Nos. 817,059 and 817,058, filed of even date, are described various methods and techniques for preparing and/or treating polyphthalocyanines to change the conductivity thereof. These polyphthalocyanines are also useful as polyphthalocyanine bodies for the thermoelectric devices of this invention, and the metal polyphthalocyanines are especially useful. Some of these methods are discussed below, but they are meant only to be illustrative of the methods and suitable polyphthalocyanine bodies produced therefrom.

It has been found that when copper polyphthalocyanine discs are heat treated in an inert atmosphere including a high vacuum at a temperature in excess of about 350° C. for a time sufficient to change the chemical structure of the discs, the thermoelectric power of the discs is appreciably improved, and preferably the heat treatment is carried out between about 400° C. and 500° C. Of course, a heat treating temperature should not be used that is so high that very rapid decomposition and deterioration of the discs will occur.

By treating or doping the copper polyphthalocyanine powder with bromine and hot pressing the treated material a disc of permanent P-type material is formed which does not change to N-type upon exposure to the atmosphere or water vapor in which case no encapsulation is necessary. Doping is known in this art as adding small amounts of foreign materials to change the conductivity degree and/or type of thermoelectric material. Normally, when treating copper polyphthalocyanine with gaseous doping agents such as bromine, hydrogen sulfide, oxygen or water vapor, the copper polyphthalocyanine will be saturated with the doping agent at the particular temperature and pressure of treatment, and actual treatments were carried out at room temperature and atmospheric pressure with these doping agents. Rather than treating the powdered material, the bodies, e.g. discs, of copper polyphthalocyanine can be treated; however, this type of treatment will probably result in unhomogeneously treated material, which can be desirable in some instances as when P-N junction material is desired. The other halogens as well as bromine used to treat copper polyphthalocyanine will also produce P-type conductivity material. Other materials to treat copper polyphthalocyanine to produce P-type material are oxygen, ozone, sulfur, selenium and tellurium. As has been pointed out hereinabove, copper polyphthalocyanine produced having an excess of copper therein will also be P-type. In the case of oxygen treatment it is desirable to encapsulate the disc in oxygen. The bromine treated or other doped P-type copper polyphthalocyanine disc can be used in the devices of FIGURES 1 and 2 and 3 with an N-type copper polyphthalocyanine disc or N-type bismuth telluride or other N-type inorganic or organic discs having thermoelectric properties.

Also, of course, using an N-type disc of copper polyphthalocyanine or doped copper polyphthalocyanine, the other discs, i.e., the P-type body or disc or leg could be a P-type bismuth telluride or other P-type inorganic or organic material having thermoelectric properties. As described hereinabove copper polyphthalocyanine produced having a stoichiometric deficiency of copper has N-type conductivity. Also water vapor-saturated copper polyphthalocyanine which is hot pressed to produce a disc or other body has N-type conductivity provided care is taken to prevent escape of water during hot pressing, or alternatively N-type conductivity can be produced after the disc is formed by water vapor treatment. This hot pressing is suitably carried out at about 220° C. and 20,000 p.s.i. Another type of treatment that produces N-type conductivity in copper polyphthalocyanine is hydrogen sulfide treatment.

The treating or doping treatment used on copper polyphthalocyanine is a method of controlling the degree of electronic (or positive hole) mobility in copper polyphthalocyanine. The degree of mobility varies with the amount and type of doping agent used. In the case of water vapor and oxygen mobility changes of the order of ten to one have been produced at room temperature (23° C.).

Copper polyphthalocyanine or doped copper polyphthalocyanine can also be used as the active ingredient in an oxygen detecting cell, since the electrical resistivity of the material increases with increasing oxygen content in a system.

Although the invention has been described in terms of specified apparatus which is set forth in considerable detail, it should be understood that this is by way of illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

What is claimed is:

1. In a thermoelectric device, the improvement comprising a polyphthalocyanine body as a thermoelectric component in said device, and electrical connections to said body.

2. A thermoelectric device comprising an N-type body and a P-type body at least one of which is a polyphthalocyanine, electrical connections joining said bodies, and other electrical connections to said bodies.

3. A thermoelectric cooling device comprising an N-type body and a P-type body at least one of which is a polyphthalocyanine, electrical connections joining said bodies, and other electrical connections for joining said bodies through a direct current source with the positive terminal of said source to be connected to said N-type body and the negative terminal of said source to be connected to said P-type body.

4. The device of claim 3, wherein a metal body for heat transfer electrically joins said N- and P-type bodies, and other metal bodies for heat transfer are to be connected in series electrically between said N- and P-type bodies and said direct current source.

5. The device of claim 3, wherein said polyphthalocyanine is a metal polyphthalocyanine.

6. The device of claim 3, wherein said polyphthalocyanine is a copper polyphthalocyanine.

7. The device of claim 3, wherein said polyphthalocyanine is a copper polyphthalocyanine which has been heated in an inert atmosphere at a temperature in excess of about 350° C. for a time sufficient to appreciably improve the thermoelectric properties.

8. The device of claim 3, wherein both of said N- and P-type bodies are copper polyphthalocyanines and said P-type body is encapsulated under high vacuum.

9. The device of claim 3, wherein both of said N- and P-type bodies are copper polyphthalocyanines which have been heated in an inert atmosphere at a temperature in excess of about 350° C. for a time sufficient to appreciably improve the thermoelectric properties, and said P-type body is encapsulated under high vacuum.

10. A thermoelectric generating device comprising an N-type body and a P-type body at least one of which is a polyphthalocyanine, electrical connections joining said bodies, other electrical connections for joining said bodies through an electrical load, and means for associating a heating source associated with a pair of the portions of said bodies.

11. The device of claim 10, wherein said heating source is to be associated with the pair of connected portions of said bodies to be connected with said load.

12. The device of claim 11, wherein means is provided for associating a cooling source with the pair of portions of said bodies connected directly together electrically.

13. The device of claim 11, wherein a metal body for heat transfer directly joins electrically said N- and P-type bodies, and metal bodies for heat transfer are provided to be connected in series electrically between said N- and P-type bodies and said load.

14. The device of claim 11, wherein said polyphthalocyanine is a metal polyphthalocyanine.

15. The device of claim 11, wherein said polyphthalocyanine is a copper polyphthalocyanine.

16. The device of claim 11, wherein said polyphthalocyanine is a copper polyphthalocyanine which has been heated in an inert atmosphere at a temperature in excess of about 350° C. for a time sufficient to appreciably improve the thermoelectric properties.

17. The device of claim 11, wherein both of said N- and P-type bodies are copper polyphthalocyanines and said P-type body is encapsulated under high vacuum.

18. The device of claim 11, wherein both of said N- and P-type bodies are copper polyphthalocyanines which have been heated in an inert atmosphere at a temperature in excess of about 350° C. for a time sufficient to appreciably improve the thermoelectric properties, and said P-type body is encapsulated under high vacuum.

References Cited in the file of this patent

Coblenz: Electronics, November 1, 1957, pages 144–149.